United States Patent
Huang et al.

(10) Patent No.: US 8,912,527 B2
(45) Date of Patent: Dec. 16, 2014

(54) MULTI-QUANTUM WELL STRUCTURE AND LIGHT EMITTING DIODE HAVING THE SAME

(71) Applicant: Advanced Optoelectronic Technology, Inc., Hsinchu Hsien (TW)

(72) Inventors: Shih-Cheng Huang, Hsinchu (TW); Ya-Wen Lin, Hsinchu (TW); Po-Min Tu, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 0 days.

(21) Appl. No.: 13/935,527

(22) Filed: Jul. 4, 2013

(65) Prior Publication Data

US 2014/0014899 A1   Jan. 16, 2014

(30) Foreign Application Priority Data

Jul. 16, 2012   (CN) .......................... 2012 1 0244973

(51) Int. Cl.
| | |
|---|---|
| *H01L 29/06* | (2006.01) |
| *H01L 33/04* | (2010.01) |
| *H01L 33/30* | (2010.01) |
| *H01L 33/02* | (2010.01) |
| *H01L 33/06* | (2010.01) |

(52) U.S. Cl.
CPC .............. *H01L 33/04* (2013.01); *H01L 33/305* (2013.01); *H01L 33/025* (2013.01); *H01L 33/06* (2013.01)

USPC ........... 257/13; 257/E21.409; 257/9; 438/290

(58) Field of Classification Search
USPC ........................ 257/9, 13, E21.409; 438/290
See application file for complete search history.

(56) References Cited

U.S. PATENT DOCUMENTS

| | | | |
|---|---|---|---|
| 5,280,182 A * | 1/1994 | Waho | ............................. 257/25 |
| 2004/0113169 A1 | 6/2004 | Asami et al. | |
| 2008/0315180 A1 | 12/2008 | Kim et al. | |
| 2010/0019223 A1 | 1/2010 | Kang et al. | |

FOREIGN PATENT DOCUMENTS

| | | |
|---|---|---|
| JP | 11-8406 A | 1/1999 |
| JP | 2000223790 A | 8/2000 |
| JP | 2003046200 A | 2/2003 |
| JP | 2003234545 A | 8/2003 |
| JP | 2010028072 A | 2/2010 |
| JP | 2010087270 A | 4/2010 |
| TW | I270989 | 1/2007 |

* cited by examiner

*Primary Examiner* — Jami M Valentine
(74) *Attorney, Agent, or Firm* — Novak Druce Connolly Bove + Quigg LLP

(57) ABSTRACT

A multi-quantum well structure includes two first barrier layers, two well layers sandwiched between the two first barrier layers, and a doped second barrier layer sandwiched between the two well layers. The second barrier layer has its conduction band and forbidden band gradually transiting to those of one of the well layers, and a dopant concentration of the second barrier layer gradually changes along a direction from one well layer to the other. The invention also relates to a light emitting diode structure having the multi-quantum well structure.

13 Claims, 4 Drawing Sheets

MULTI-QUANTUM WELL STRUCTURE AND LIGHT EMITTING DIODE HAVING THE SAME

BACKGROUND

1. Technical Field

The present disclosure generally relates to semiconductor structures, and particularly to a multi-quantum well structure and a light emitting diode (LED) structure having the multi-quantum structure, wherein the multiple-quantum well structure has at least one composition grading barrier layer.

2. Description of the Related Art

LEDs have many advantages, such as high luminosity, low operational voltage, low power consumption, compatibility with integrated circuits, faster switching, long term reliability, and environmental friendliness which have promoted their wide use as a light source.

A conventional LED structure includes a multi-quantum well structure. The multi-quantum well structure includes a plurality of barrier layers and a plurality of well layers alternating with each other, wherein the well layers are spaced by the barrier layers. An energy band gap between each conduction band and a corresponding forbidden band of the well layer is smaller than that of between each conduction band and a corresponding forbidden band of the barrier layers. Accordingly, the electric holes moving from a P-type semiconductor layer to an N-type semiconductor layer and electrons moving from the N-type semiconductor layer to the P-type semiconductor layer are confined at the well layer since the barrier layers having greater energy band gap, and photons are obtained in the well layer to emit when conjunctions of the electrons and the electric holes occur.

However, in the conventional multi-quantum structure, moving speed of the electric holes is much slower than that of the electrons since the electric holes are heavier than the electrons. Accordingly, the electrons and the electric holes are not evenly arranged in the well layer, and an emitting efficiency of the LED structure is low.

Therefore, it is desirable to provide a multi-quantum well structure which can overcome the above-described problems.

BRIEF DESCRIPTION OF THE DRAWINGS

Many aspects of the disclosure can be better understood with reference to the drawings. The components in the drawings are not necessarily drawn to scale, the emphasis instead being placed upon clearly illustrating the principles of the present multi-quantum well structure. Moreover, in the drawings, all the views are schematic, and like reference numerals designate corresponding parts throughout the views.

DETAILED DESCRIPTION

Figure 1:
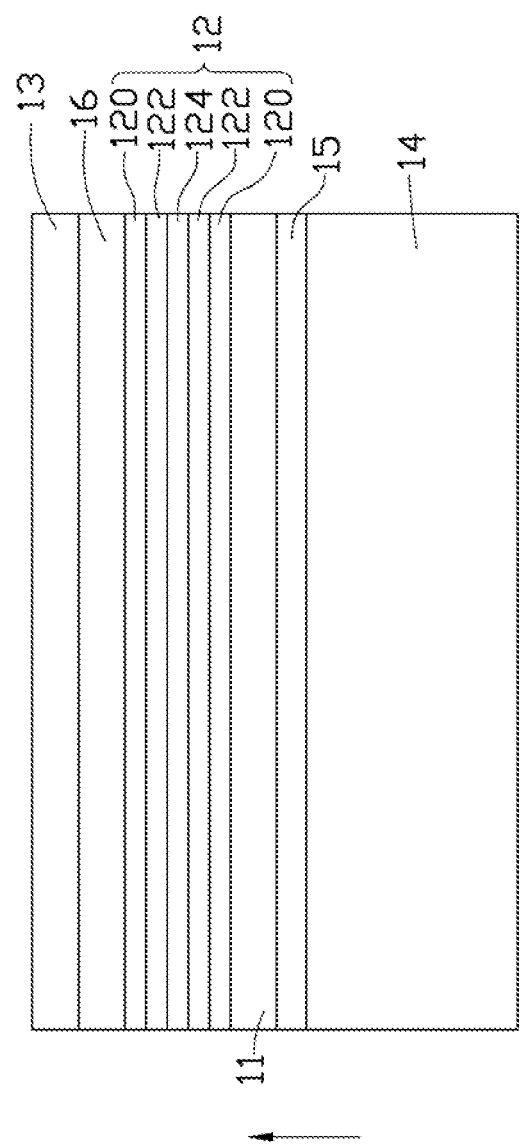
FIG. 1 is a cross-sectional, schematic view of a light emitting diode having a multi-quantum well structure in accordance with an exemplary embodiment of the present disclosure.
Figure 2:
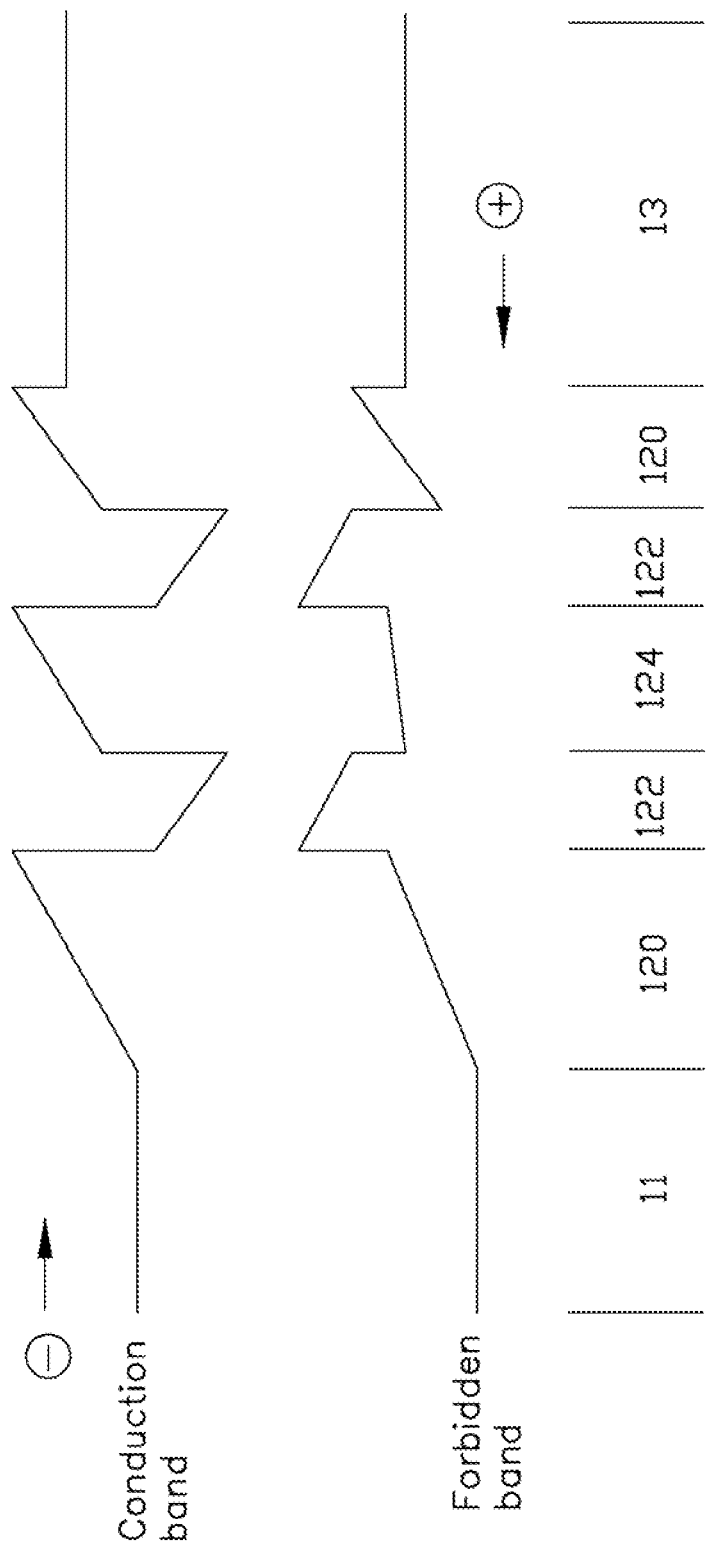
FIG. 2 shows an energy band of the multi-quantum well structure of FIG. 1.

Referring to FIGS. 1 and 2, an LED structure 10 in accordance with an embodiment is provided. The LED structure 10 includes a first conductive semiconductor layer 11, a multi-quantum well structure 12 and a second conductive semiconductor layer 13.

The first conductive semiconductor layer 11 is an N-type GaN layer. In this embodiment, the first conductive semiconductor layer 11 is formed on a sapphire substrate 14. Preferably, a nucleation layer 15 is preformed on the sapphire substrate 14, and the first conductive semiconductor layer 11 is formed on the nucleation layer 15.

The multi-quantum well structure 12 is formed on the first conductive semiconductor layer 11. The multi-quantum well structure 12 includes two first barrier layers 120, two well layers 122 sandwiched between the two first barrier layers 120, and a second barrier layer 124 sandwiched between the two well layers 122.

The second barrier layer 124 has its conduction band and forbidden band gradually transiting to those of the well layer 122 adjacent to the second barrier layer 124 respectively. In this embodiment, the second barrier layer 124 is a GaN semiconductor layer doped with In therein.

The second conductive semiconductor layer 13 is a doped P-type GaN layer. The second conductive semiconductor 13 is formed on the multi-quantum well structure 12. In this embodiment, a P-type AlGaN layer 16 is sandwiched between the second conductive semiconductor layer 13 and the multi-quantum structure 12.

Figure 4:
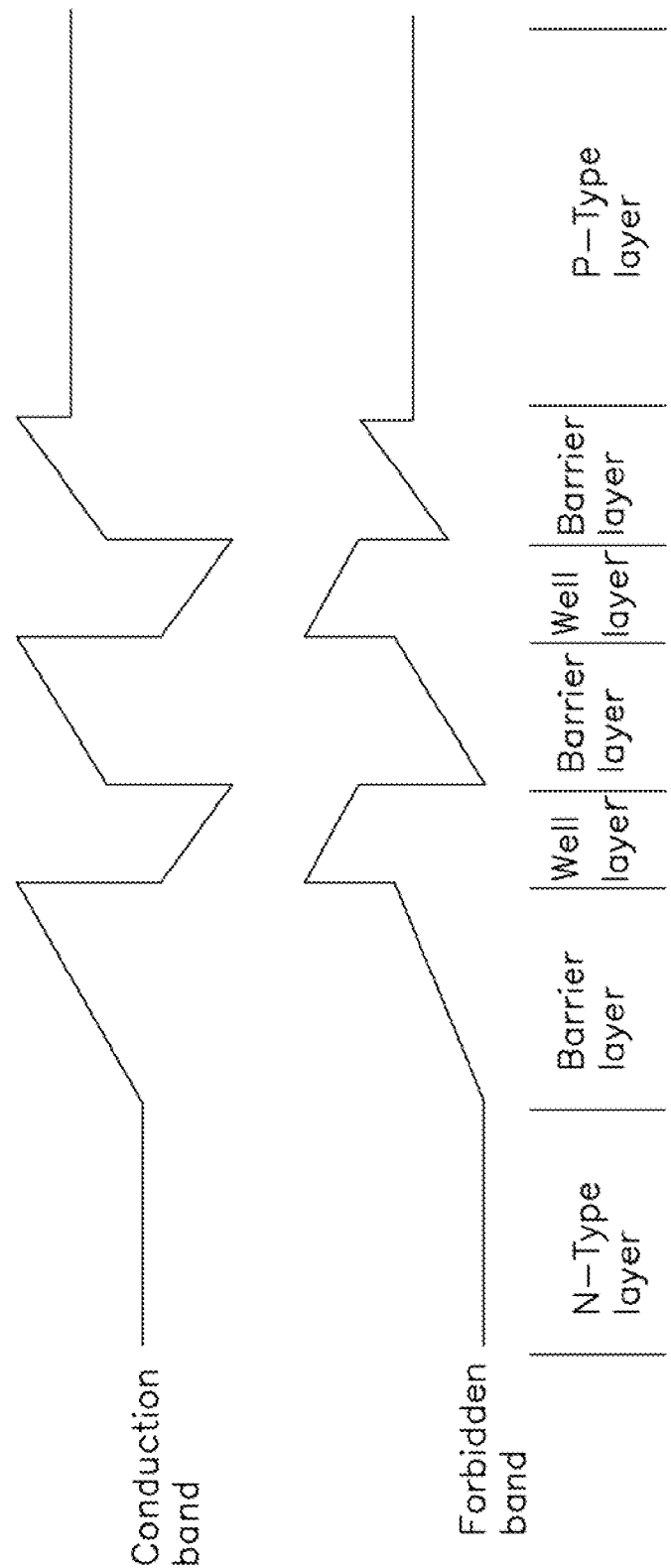
FIG. 4 shows an energy band of a conventional multi-quantum well structure.

Referring FIGS. 2 and 4, comparing energy levels of the multi-quantum layers of the present disclosure with the conventional multi-quantum well structure, in FIG. 2, the forbidden levels of second barrier layer 124 with a smaller variation range of the present disclosure can decrease a forbidden level difference between the second barrier layer 124 and the well layer 122, as such the electric holes moving from the first conductive semiconductor layer 13 to the first conductive semiconductor layer 11 will suffer smaller resistance and thereby move more easily, and the number of the electric holes arranged in the multi-quantum well structure 12 is increased, so that the electric holes and the electrons are evenly arranged in the multi-quantum well structure 12 and correspondingly the emitting efficiency of the multi-quantum well structure 12 is increased.

Two technical programs about manufacturing material of layers of the multi-quantum well structure 12 are provided to reach the above technical effects.

First, the first barrier layer 120 is made of GaN, the well layer 122 is made of $In_xGa_{1-x}N$, the second barrier layer 124 is made of $In_yGa_{1-y}N$, and $x > y \geq 0$, and y approaches 0 along a direction from a bottom of the well layer 122 to a top of the well layer 122 (that is a forming direction of layers of the LED structure 10 as shown by the arrow in FIG. 1), so that the second barrier layer 124 has its conduction band and forbidden band gradually transiting to those of the well layer 122 adjacent to the second barrier layer 124 respectively.

Second, the first barrier layer 120 is made of $Al_zGa_{1-z}N$, the well layer 122 is made of $In_xGa_{1-x}N$, the second barrier layer 124 is made of $Al_yGa_{1-y}N$, and $x > 0$, $z > y \geq 0$, and y approaches z along a direction from a bottom of the well layer 122 to top of the well layer 122 (that is a forming direction of layers of the LED structure 10), so that the second barrier layer 124 has its conduction band and forbidden band gradually transiting to those of the well layer 122 adjacent to the second barrier layer 124 respectively.

Further, the multi-quantum well structure 12 includes two first barrier layers 120, two or more well layers 122 sandwiched between the two first barrier layers 120, and a second barrier layer 124 sandwiched each two adjacent well layers 122. The second barrier layer 124 near the second conductive semiconductor layer 13 has its conduction band and forbidden band gradually transiting to those of the well layer 122 adjacent thereto respectively.

Alternatively, the number of the well layer 122 can be three or more, and correspondingly, the number of second barrier layer 124 sandwiched between each two adjacent well layers 122 can be two or more.

Figure 3:
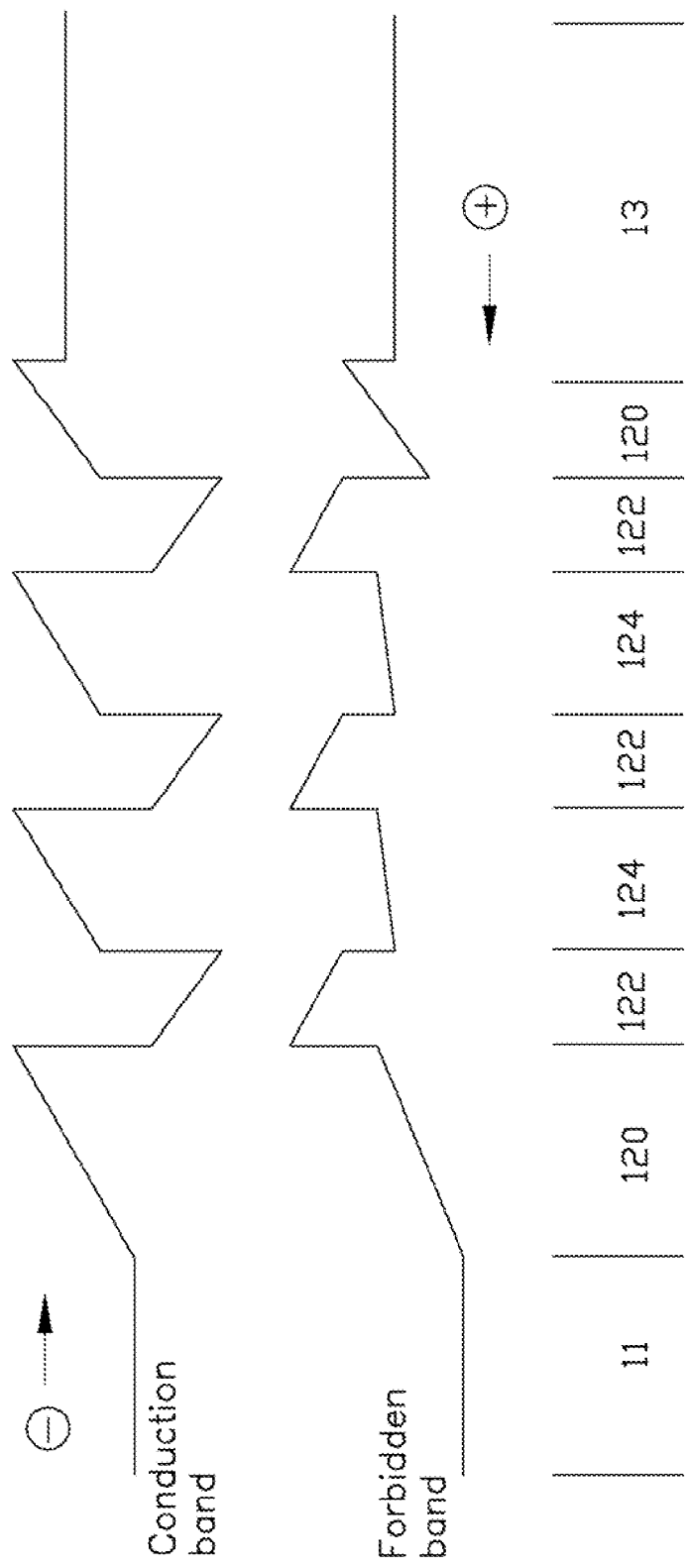
FIG. 3 shows an energy band of a multi-quantum well structure in accordance with another embodiment of the present disclosure.

Referring to FIG. 3, three first barrier layers 122 and two second barrier layers 124 are sandwiched between the two first barrier layers 120 of the multi-quantum well structure 12. Manufacturing materials of the first barrier layers 120, the well layers 122 and the second barrier layer can be chosen according to above programs.

Alternatively, if only one second barrier layer 124 mostly near to the doped P-type semiconductor layer 13 having a small forbidden band level variation range could also increase emitting efficiency of the LED structure 10, wherein the other second barrier layers 124 are not limited to the above structure and materials.

It is to be understood that the above-described embodiments are intended to illustrate rather than limit the disclosure. Variations may be made to the embodiments without departing from the spirit of the disclosure. The above-described embodiments illustrate the scope of the disclosure but do not restrict the scope of the disclosure.

What is claimed is:

1. A multi-quantum well structure for a light emitting diode comprising:
   two first barrier layers;
   two well layers sandwich between the two first barrier layers;
   a doped second barrier sandwiched between the two well layers, the second barrier layer having its conduction band and forbidden band gradually transiting to those of the well layer adjacent to the second barrier layer respectively, and a dopant concentration of the second barrier layer gradually changing along a direction from one well layer to the other well layer.

2. The multi-quantum well structure of claim 1, wherein each of the well layers is made of $In_xGa_{1-x}N$, and X is greater than 0.

3. The multi-quantum well structure of claim 2, wherein each of the first barrier layers is made of GaN, the second barrier layer is made of $In_yGa_{1-y}N$, and $x>y\geq0$, y approaching to 0 along the direction from one well layer to the other well layer.

4. The multi-quantum well structure of claim 2, wherein each of the first barrier layers is made of $Al_zGa_{1-z}N$, the second barrier layer is made of $Al_yGa_{1-y}N$, and $z>y\geq0$, y approaching to z along the direction from one well layer to the other well layer.

5. A light emitting diode (LED) structure comprising:
   a first conductive semiconductor layer;
   a second conductive semiconductor layer;
   at least one multi-quantum well structure sandwiched between the first conductive semiconductor well structure and the second conductive semiconductor layer, the multi-quantum well structure comprising:
   two first barrier layers;
   two well layers sandwich between the two first barrier layers;
   a doped second barrier sandwiched between the two well layers, the second barrier layer having its conduction band and forbidden band gradually transiting to those of the well layer adjacent to the second barrier layer respectively, and a dopant concentration of the second barrier layer gradually changing along a direction from one well layer to the other well layer.

6. The LED structure of claim 5, wherein each of the well layers is made of $In_xGa_{1-x}N$, and X is greater than 0.

7. The LED structure of claim 6, wherein each of the first barrier layers is made of GaN, the second barrier layer is made of $In_yGa_{1-y}N$, and $x>y\geq0$, y approaching to 0 along the direction from one well layer to the other well layer.

8. The LED structure of claim 6, wherein each of the first barrier layers is made of $Al_zGa_{1-z}N$, the second barrier layer is made of $Al_yGa_{1-y}N$, and $z>y\geq0$, y approaching to z along the direction from one well layer to the other well layer.

9. The LED structure of claim 5, wherein the first conductive semiconductor is a doped N-type GaN semiconductor layer.

10. The LED structure of claim 8 further comprises a sapphire substrate and a nucleation layer formed on the sapphire substrate, the doped N-type GaN being arranged on the nucleation layer.

11. The LED structure of claim 10, wherein the second conductive semiconductor layer is a doped P-type GaN semiconductor layer.

12. The LED structure of claim 11, wherein a doped P-type AlGaN layer is sandwiched between the dope P-type GaN semiconductor layer and the multi-quantum well structure.

13. A light emitting diode (LED) comprising:
   an N-type semiconductor layer;
   a P-type semiconductor layer;
   a multi-quantum well structure sandwiched between the N-type semiconductor layer and the P-type semiconductor layer, the multi-quantum well structure comprising:
   two first barrier layers;
   a plurality of well layers sandwiched between the two first barrier layers;
   a plurality of doped second barrier layers, each barrier layer being sandwiched between two adjacent well layers, the second barrier layer having its conduction band and forbidden band gradually transiting to those of the well layer adjacent to the second barrier layer respectively, and a dopant concentration of the second barrier layer nearest to the P-type semiconductor layer gradually changing along a direction from one well layer to the other well layer nearest to the second barrier layer.

* * * * *